United States Patent [19]

Cerda

[11] Patent Number: 5,127,062
[45] Date of Patent: Jun. 30, 1992

[54] SYSTEM FOR FORMING A WIRING HARNESS IN A PLANE

[75] Inventor: Léon G. Cerda, Carry-Le-Rouet, France

[73] Assignee: Aerospatiale Societe Nationale Industrielle, Paris, France

[21] Appl. No.: 473,451

[22] Filed: Feb. 1, 1990

[30] Foreign Application Priority Data

Feb. 7, 1989 [FR] France .................. 89 01541

[51] Int. Cl.⁵ .............................. G06K 9/00
[52] U.S. Cl. .......................... 382/8; 382/1; 324/66
[58] Field of Search ........... 382/1, 8; 324/508, 66; 340/651; 372/24

[56] References Cited

U.S. PATENT DOCUMENTS 2,805,471  4/1957  Lowden .................. 29/155.5
4,959,792  9/1990  Sullivan .................. 340/651

FOREIGN PATENT DOCUMENTS 1221641  3/1971  United Kingdom .
2014775  7/1979  United Kingdom .

Primary Examiner—David K. Moore
Assistant Examiner—Yon Tung
Attorney, Agent, or Firm—Fisher, Christen & Sabol

[57] ABSTRACT

A system for forming, in a plane, a wiring harness having a plurality of conductors each of which must follow a predetermined path, of the type which has: (a) a flat support; (b) a unit for representing each of the paths on the support; and (c) a unit for provisionally holding the conductors in position along their path. The representation unit is a coherent light beam generator, for which the flat support plays the role of screen, and which is capable of scanning the flat support so as to display thereon the light trace of the path of a given conductor of the harness. The system further has a unit for storing the information relative to the paths of the different conductors of the wiring harness, which unit is connected both to a unit for identifying a given conductor and to a unit for controlling the beam generator for displaying, on the support, the path specific to the given conductor.

5 Claims, 4 Drawing Sheets

SYSTEM FOR FORMING A WIRING HARNESS IN A PLANE

BACKGROUND OF THE INVENTION

The present invention relates to a system for forming, in a plane, a wiring harness comprising a plurality of conductors or cables each of which must follow a predetermined path.

The invention applies more particularly, although not exclusively, to the formation of wiring harnesses for aircraft, and particularly helicopters, in which said harnesses, connecting together the numerous pieces of electric and electronic equipment required for piloting said aircraft and for carrying out the different missions with which they are entrusted, are very complex and varied.

Before installing said wiring harnesses, for example in an aircraft which they are to equip, it is necessary to shape said harnesses, in accordance with the internal arrangement of the aircraft, on long tables (up to ten meters in length), each cable or conductor extending on the table between specific lead-in and lead-out positions, while following a predetermined path.

At the present time, the path of the different conductors forming the wiring harness are represented graphically on a sheet of paper disposed on the table, under a transparent plate having a plurality of holes for receiving guide pins for provisionally holding the conductors in position along their path.

For each conductor to be positioned, the operator must first of all identify it then, with technical documentation, seek among the plurality of paths represented the one which corresponds to the conductor which he has just identified. The operator may then place the conductor along the outline of its path and hold it there by means of guide pins disposed by the operator at appropriate positions of the path. The operator must of course then begin the same set of operations again for each conductor of the harness.

Such work is obviously fastidious and errors are practically inevitable considering, on the one hand, the length of the tables and, on the other, the fact that the formation of such wiring harnesses may use several hundred conductors. Even if a "layout" of the harness is represented on the table, the operator is in fact confronted with a veritable "jumble" of tangled conductors which are difficult to straighten out.

SUMMARY OF THE INVENTION

The object of the present invention is to avoid such drawbacks and provides a system for simply and reliably forming wiring harnesses on the flat.

For this, the system for forming, in a plane, a wiring harness comprising a plurality of conductors each of which must follow a predetermined path, of the type comprising:
a flat support,
means for representing each of said paths on said support, and
means for provisionally holding said conductors in position along their path, is remarkable, in accordance with the invention, in that said representation means comprise a coherent light beam generator, for which said flat support plays the role of screen, and which is capable of scanning said flat support so as to display thereon the light trace of the path of a given conductor of said harness, and in that said system further comprises means for storing said information relative to the paths of the different conductors of the wiring harness, which means are connected both to means for identifying a given conductor and to means for controlling said beam generator for displaying, on said support, the path specific to said given conductor.

Thus, with the system of the invention, the operator has available, in an automated way, all the information required for forming a wiring harness, conductor by conductor (identification of a given conductor and display of the outline of its path).

Advantageously, said beam scans said support at a sufficiently high speed to obtain optical persistence of said outline.

Furthermore, in the case where, in a way known per se, said means for provisionally holding the conductors in place are formed of guide pins intended to be inserted in holes provided in a transparent plate covering said flat support, in accordance with the invention said generator may be controlled so that said beam designates successively a given series of holes in which said pins must be inserted, thus forming a path layout for each of said conductors.

According to another feature of the invention, said identification means are formed by a bar code reader.

According to another feature of the invention, said generator is a low power laser beam generator.

BRIEF DESCRIPTION OF THE DRAWINGS

The figures of the accompanying drawings will better show how the invention may implemented.

DESCRIPTION OF THE PREFERRED EMBODIMENTS

Figure 1:
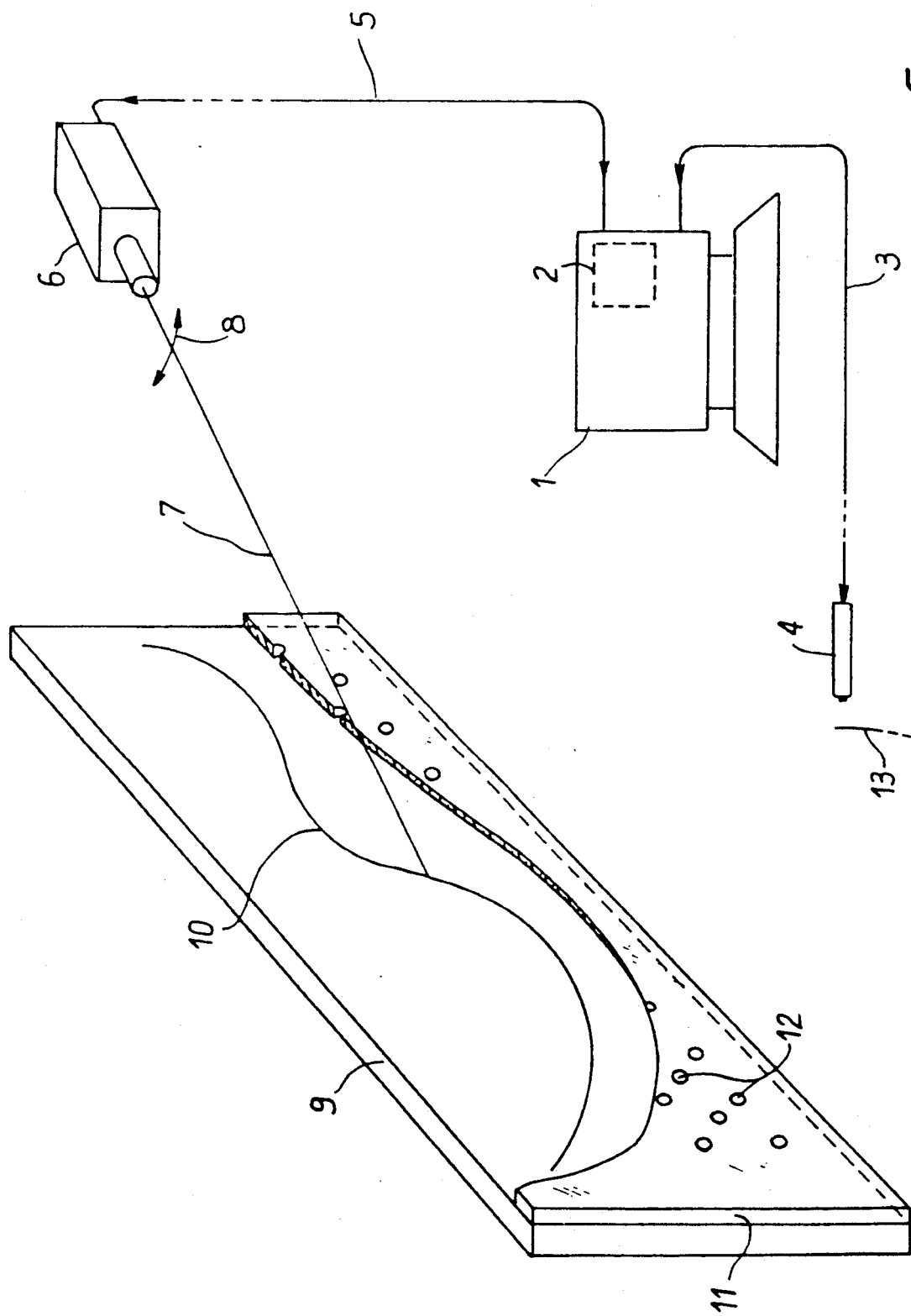
FIG. 1 illustrates schematically the system for forming a wiring harness on the flat in accordance with the invention.

Referring to FIG. 1, the system of the invention comprises a micro-computer 1, having a memory 2 for storing the information relative to the paths of the different conductors of the wiring harness, and connected, by a connection 3, to a bar code reader 4 for identifying each of the conductors of said harness and, by a connection 5, to a generator 6 capable of emitting a low power laser beam 7. With a given conductor 13 identified by means of reader 4, for which conductor the information concerning its specific path is stored in memory 2, the processor of the micro-computer 1 is adapted for driving generator 6 so that the laser beam 7 scans (double arrow 8) the flat support 9 so as to display, on said support, which plays the role of screen, a light trace 10 of the path of said conductor. The scanning speed of the laser beam 7 is sufficiently great to obtain optical persistence of said outline 10.

Furthermore, a transparent plate 11 covers support 9 and has a plurality of holes 12 disposed, for example, in lines and columns in a staggered arrangement, each of said holes 12 being capable of receiving a guide pin for provisionally holding the conductors in position, as will be explained in greater detail hereafter with reference to FIGS. 2a to 2f.

Figure 2A:
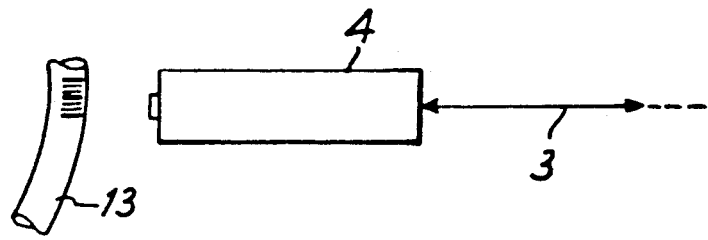
FIGS. 2a to 2f are partial front views, on a larger scale, of the flat support covered by a transparent plate, used in the system of the invention, illustrating the different steps for forming a wiring harness.
Figure 2B:
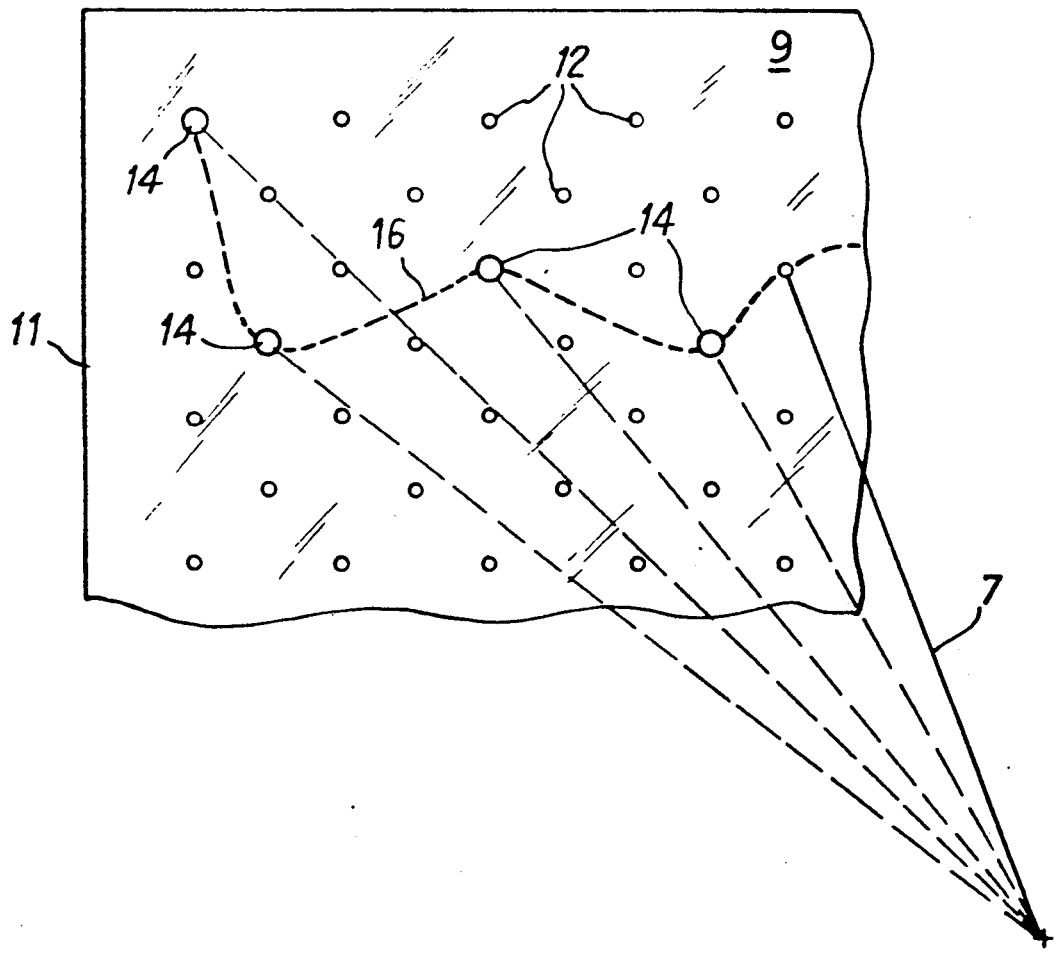

In fact. after conductor 13 has been identified by the bar code reader 4 (FIG. 2a) and prior to positioning of said conductor, the generator may be controlled so that beam 7 designates successively a given series of holes 12. in each of which the operator inserts a guide pin 14, thus finally obtaining a layout 16 of the path for said conductor (broken lines in FIG. 2b).

Figure 2C:
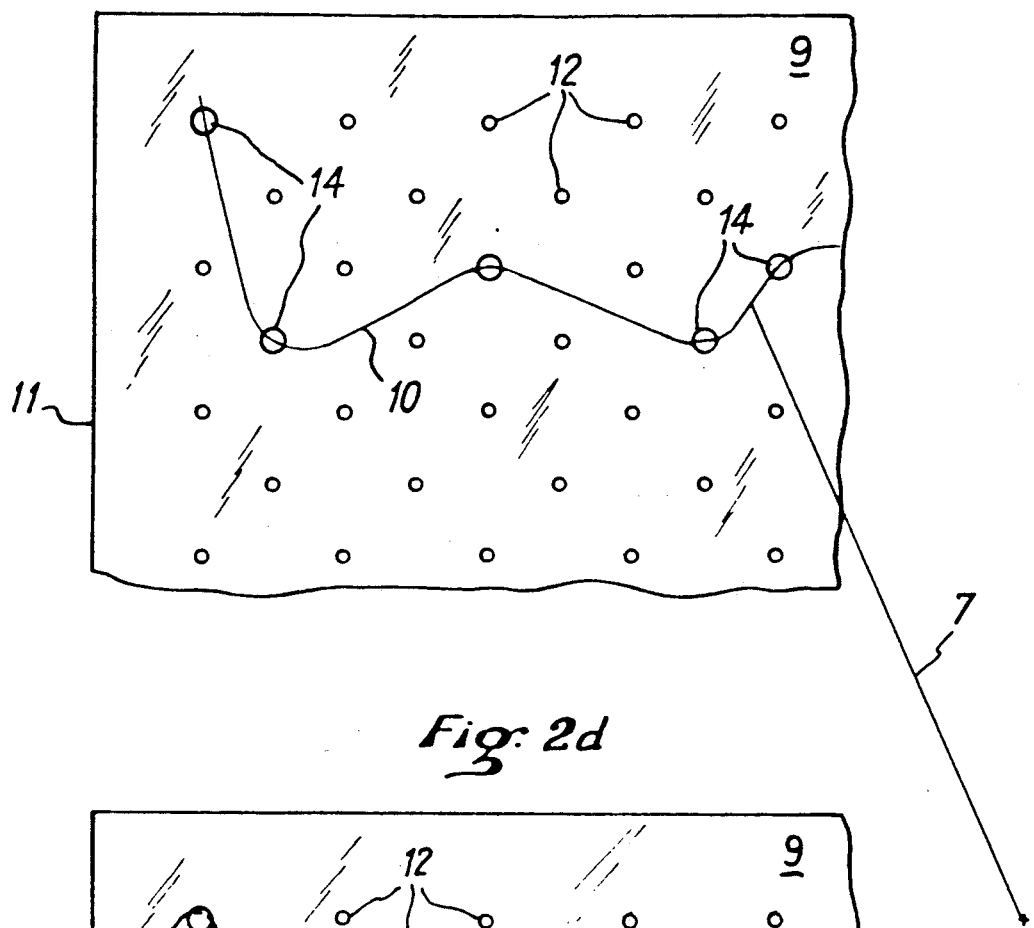

Once this preliminary operation is finished. and as is shown in FIG. 2c, the generator is controlled so that the laser beam 7 scans, at high speed, support 7 which plays the role of screen, on which the light trace of the path 10 of the conductor to be positioned appears.

The beam generator 2 is controlled by the microcomputer 1 depending on the information relating to the specific path of the conductor to be positioned, which is stored in memory 2, whether during this operation or during the preliminary operation of positioning the guide pins. As already mentioned. the high scanning speed makes it possible to obtain optical persistence of the light trace.

Figure 2D:
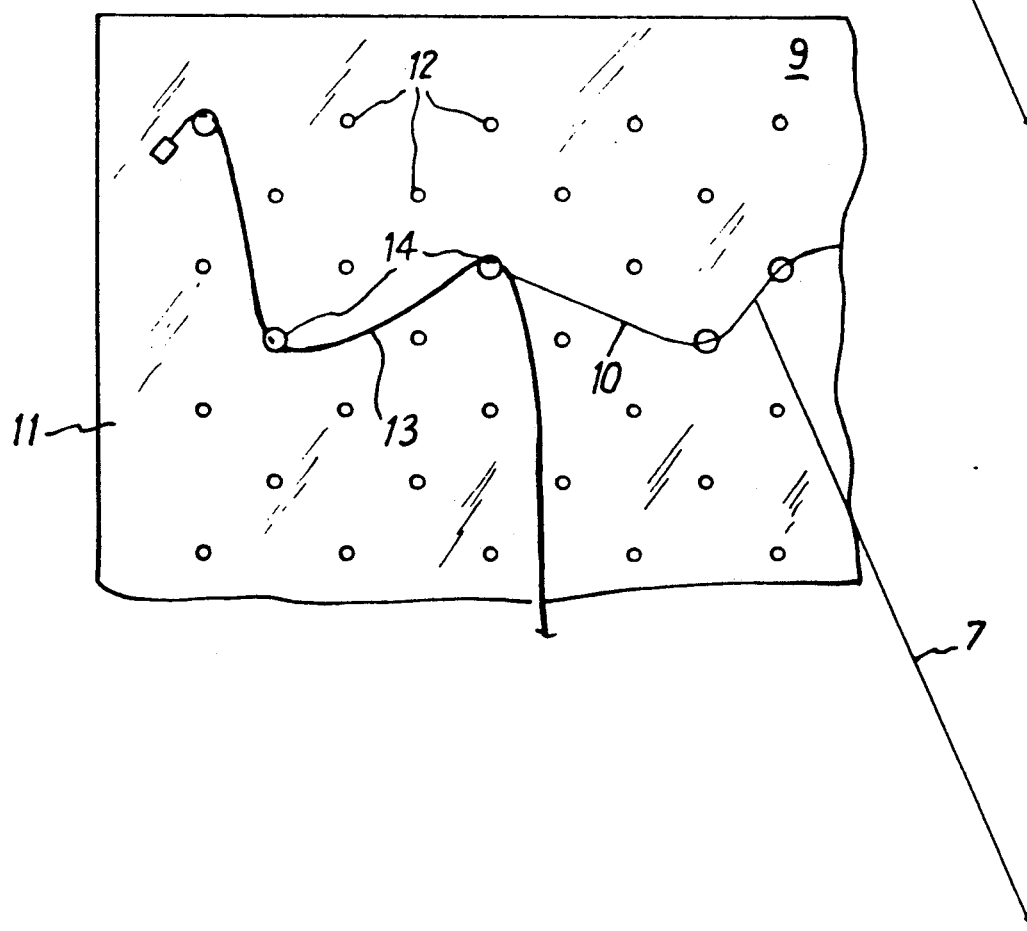
Figure 2E:
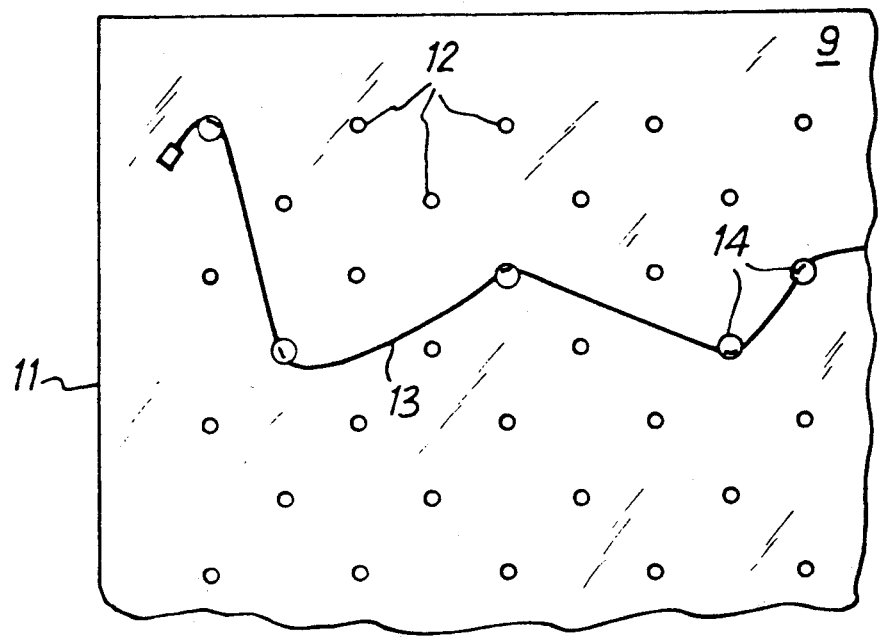

FIG. 2d shows the conductor 13 during positioning by means of guide pins 14, by following path 10 whose outline is continually displayed on support 9 which plays the role of screen.

Figure 2F:
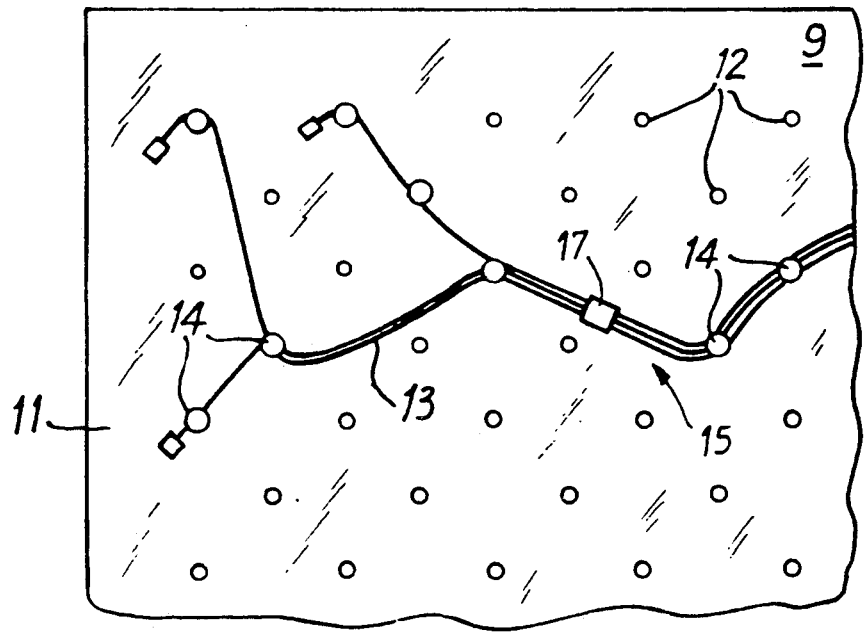

Once a conductor 13 (FIG. 2e) has been positioned, the set of preceding operations will be repeated in the same way for all the other conductors, so as to obtain the wiring harness 15, obviously simplified with respect to an actual case, in FIG. 2f, for reasons of clarity of the drawings. the conductors being joined if required by clamping sheaths or collars 17.

The system of the invention delivers to the operator, in an automated way. all the information he requires for positioning the conductors of a wiring harness one after the other, using a micro-computer. whose memory contains all the information related to the path of each conductor of the wiring harness to be formed, which drives a laser beam generator which signals, by a light trace on a support which plays the role of screen, the geographical position of the lead-in and lead-out connectors, as well as the route which each conductor selected by the operator must follow and identified by means of the bar code reader.

What is claimed is:

1. A system for forming, in a plane. a wiring harness comprising a plurality of conductors which must follow predetermined paths, comprising:
   a flat support,
   means for provisionally holding said conductors in position along their path,
   means for representing each of said paths on said support, comprising a laser beam generator, for which said flat support acts as a screen, which is capable of scanning said flat support so as to display thereon the light trace of the path of a given conductor of said harness, and
   means for storing information relative to the paths of the different conductors of the wiring harness, which storing means are connected both to means for identifying a given conductor and to means for controlling said laser beam generator for displaying on said support, the path specific to said given conductor.

2. The system as claimed in claim 1 wherein said laser beam generator scans said support at a sufficiently high speed to obtain optical persistence of the light trace of the path specific to said given conductor.

3. The system as claimed in claim 1 in which said means for provisionally holding the conductors in place are formed of guide pins intended to be inserted in holes provided in a transparent plate covering said flat support. wherein said laser beam generator may be controlled so that said laser beam generator designates successively a given series of holes in which said pins must be inserted, thus forming a path layout for each of said conductors.

4. The system as claimed in claim 1 wherein said means for identifying a given conductor is formed by a bar code reader.

5. The system as claimed in claim 1, wherein said laser beam generator is a low power laser beam generator.

* * * * *